United States Patent
Kim

(10) Patent No.: US 9,825,599 B2
(45) Date of Patent: Nov. 21, 2017

(54) SIGNAL TRANSMITTING-RECEIVING APPARATUS

(71) Applicant: Samsung Electro-Mechanics Co., Ltd., Suwon-si (KR)

(72) Inventor: Hong In Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/962,620

(22) Filed: Dec. 8, 2015

(65) Prior Publication Data

US 2016/0164568 A1 Jun. 9, 2016

(30) Foreign Application Priority Data

Dec. 8, 2014 (KR) ........................ 10-2014-0175268

(51) Int. Cl.
| | |
|---|---|
| *H04B 1/525* | (2015.01) |
| *H03F 3/19* | (2006.01) |
| *H04W 4/00* | (2009.01) |
| *H03F 3/68* | (2006.01) |
| *H03F 3/72* | (2006.01) |
| *H04W 84/12* | (2009.01) |

(52) U.S. Cl.
CPC ................. *H03F 3/19* (2013.01); *H03F 3/68* (2013.01); *H03F 3/72* (2013.01); *H04B 1/525* (2013.01); *H04W 4/008* (2013.01); *H03F 2200/111* (2013.01); *H03F 2200/294* (2013.01); *H03F 2200/451* (2013.01); *H03F 2203/7209* (2013.01); *H04W 84/12* (2013.01)

(58) Field of Classification Search
None
See application file for complete search history.

(56) References Cited

U.S. PATENT DOCUMENTS

| | | | |
|---|---|---|---|
| 9,369,007 B2* | 6/2016 | Kim ........................ | H02J 17/00 |
| 2006/0073792 A1* | 4/2006 | Schoning ............... | H04B 1/525 |
| | | | 455/83 |
| 2010/0216413 A1* | 8/2010 | Khannur ................ | H04B 1/525 |
| | | | 455/78 |
| 2010/0227570 A1* | 9/2010 | Hendin .................. | H04B 1/006 |
| | | | 455/78 |
| 2010/0248799 A1* | 9/2010 | Lum ....................... | H01Q 21/28 |
| | | | 455/575.7 |

(Continued)

FOREIGN PATENT DOCUMENTS

| | | |
|---|---|---|
| JP | 2002-198856 A | 7/2002 |
| JP | 2004-193866 A | 7/2004 |
| KR | 10-1179206 B1 | 9/2012 |

*Primary Examiner* — David Bilodeau
(74) *Attorney, Agent, or Firm* — NSIP Law

(57) ABSTRACT

A signal transmitting-receiving apparatus includes a first switching section, a second switching section, a controller, and an isolation unit. The first switching section is configured to connect Bluetooth signal receiving lines to a Bluetooth antenna. The second switching section configured to connect antennas to one of a Bluetooth receiving terminal, a Wi-Fi signal receiving terminal, and a Wi-Fi signal transmitting terminal. The controller is configured to signal process the Bluetooth signal and a Wi-Fi signal that are transmitted and received. The isolation unit is configured to suppress a signal coupling between the transmitted Bluetooth signal and the Bluetooth signal receiving lines.

8 Claims, 5 Drawing Sheets

(56) References Cited

U.S. PATENT DOCUMENTS

2013/0157690 A1\* 6/2013 Lefevre .............. A63F 3/00643
　　　　　　　　　　　　　　　　　　　　　　455/456.1
2015/0358041 A1\* 12/2015 Li ....................... H04B 1/1036
　　　　　　　　　　　　　　　　　　　　　　455/188.1

\* cited by examiner

SIGNAL TRANSMITTING-RECEIVING APPARATUS

CROSS-REFERENCE TO RELATED APPLICATION

This application claims the priority and benefit under 35 USC 119(a) of Korean Patent Application No. 10-2014-0175268 filed on Dec. 8, 2014, with the Korean Intellectual Property Office, the disclosure of which is incorporated herein by reference.

BACKGROUND

1. Field

The following description relates to a signal transmitting-receiving apparatus using a Bluetooth scheme and a Wi-Fi scheme.

2. Description of Related Art

In accordance with activation of location-based services, apparatuses and methods that provide location-based services indoors as well as outdoors have been proposed.

As the location-based services, many apparatuses and methods have been proposed based on a mobile-centric configuration, rather than a server-centric configuration.

As apparatuses and methods to provide the location-based services, an angle of arrival (AOA) technology using a Bluetooth scheme is rapidly spreading.

A signal transmitting-receiving apparatus using Bluetooth AOA technology incorporates Bluetooth and a Wi-Fi module. In a case in which a Bluetooth AOA operation and a Wi-Fi signal reception operation are simultaneously performed, a problem occurs in which a coupled Bluetooth transmission signal influences a Wi-Fi signal reception operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a signal transmitting-receiving apparatus, including: a first switching section configured to connect Bluetooth signal receiving lines to a Bluetooth antenna; a second switching section configured to connect antennas to one of a Bluetooth receiving terminal, a Wi-Fi signal receiving terminal, and a Wi-Fi signal transmitting terminal; a controller configured to signal process the Bluetooth signal and a Wi-Fi signal that are transmitted and received; and an isolation unit configured to suppress a signal coupling between the transmitted Bluetooth signal and the Bluetooth signal receiving lines.

The isolation unit may include pin diodes.

The pin diodes may be connected in a middle position of the Bluetooth signal receiving lines, anodes of the pin diodes may be configured to be connected to the Bluetooth receiving terminal of the second switching section, and cathodes of the pin diodes may be configured to be connected to the Bluetooth receiving terminal of the first switching section.

Anodes of the pin diodes may be connected to the Bluetooth signal receiving lines, and cathodes of the pin diodes may be connected to a ground.

A number of pin diodes may be proportional to a number of Bluetooth signal receiving lines.

The second switching section may further include: diplexers may be configured to be connected to the antennas to respectively provide signal transfer paths of a Wi-Fi signal of a first frequency band and a Wi-Fi signal of a second frequency band; and switching parts may be configured to be connected to the diplexers to switch transmission and reception of the Wi-Fi signal of the first frequency band and the Wi-Fi signal of the second frequency band.

Each of the switching parts may include: a first switching unit may be configured to switch the transmission and reception of the Wi-Fi signal of the first frequency band; and a second switching unit may be configured to switch the transmission and reception of the Wi-Fi signal of the second frequency band and switching a signal transfer path of the Bluetooth signal received from one of the antennas transmitting and receiving the Wi-Fi signal of the second frequency band.

The second switching unit further includes: low noise amplifiers may be configured to amplify a level of the received Wi-Fi signal of the second frequency band.

In accordance with an embodiment, there is provided a signal transmitting-receiving apparatus, including: a first switching section may be configured to connect Bluetooth signal receiving lines to a Bluetooth antenna; a second switching section may be configured to connect antennas to one of a Bluetooth receiving terminal, a Wi-Fi signal receiving terminal, and a Wi-Fi signal transmitting terminal; a controller may be configured to signal process the Bluetooth signal and a Wi-Fi signal that are transmitted and received; and an isolation unit may be configured to suppress the transmitted Bluetooth signal from being coupled to the Wi-Fi signal receiving terminal along the Bluetooth signal receiving lines.

The isolation unit further may include: pin diodes connected in a middle position of the Bluetooth signal receiving lines, anodes of the pin diodes may be configured to be connected to the Bluetooth receiving terminal of the second switching section, and cathodes of the pin diodes may be configured to be connected to the Bluetooth receiving terminal of the first switching section.

The isolation unit further may include: pin diodes may be configured to be connected between the Bluetooth signal receiving lines and a ground, anodes of the pin diodes may be configured to be connected to the Bluetooth signal receiving lines, and cathodes of the pin diodes may be configured to be connected to a ground.

The second switching section further may include: diplexers may be configured to be connected to the antennas to respectively provide signal transfer paths of a Wi-Fi signal of a first frequency band and a Wi-Fi signal of a second frequency band; and switching parts may be configured to be connected to the diplexers to switch transmission and reception of the Wi-Fi signal of the first frequency band and the Wi-Fi signal of the second frequency band.

Each of the switching parts may include: a first switching unit may be configured to switch the transmission and reception of the Wi-Fi signal of the first frequency band; and a second switching unit may be configured to switch the transmission and reception of the Wi-Fi signal of the second frequency band and switching a signal transfer path of the Bluetooth signal received from one of the antennas transmitting and receiving the Wi-Fi signal of the second frequency band.

The second switching unit further may include: low noise amplifiers may be configured to amplify a level of the received Wi-Fi signal of the second frequency band.

In accordance with an embodiment, there is provided a signal transmitting-receiving apparatus, including: a controller configured to generate at least one of a Bluetooth signal and a Wi-Fi signal; a first switching section configured to connect the controller through a Bluetooth signal transmitting-receiving line to a Bluetooth antenna to transmit the Bluetooth signal; and a second switching section configured to connect with the first switching section through Bluetooth signal receiving lines and an isolation unit to receive Bluetooth signals from antennas, and configured to at least one of connect the antennas to Wi-Fi signal transmitting-receiving lines to transmit the Wi-Fi signal, and connect the antennas to the Wi-Fi signal transmitting-receiving lines to receive and relay Wi-Fi signals to the controller, wherein the isolation unit suppresses a signal coupling between the Bluetooth signal to be transmitted and the Bluetooth signal receiving lines.

The isolation may suppress the transmitted Bluetooth signal from being coupled to the Wi-Fi signal receiving terminal along the Bluetooth signal receiving lines The second switching section further may include: diplexers may be configured to be connected to the antennas to respectively provide signal transfer paths of a Wi-Fi signal of a first frequency band and a Wi-Fi signal of a second frequency band; and switching parts may be configured to be connected to the diplexers to switch transmission and reception of the Wi-Fi signal of the first frequency band and the Wi-Fi signal of the second frequency band.

Other features and aspects will be apparent from the following detailed description, the drawings, and the claims.

BRIEF DESCRIPTION OF DRAWINGS

These and/or other aspects will become apparent and more readily appreciated from the following description of the embodiments, taken in conjunction with the accompanying drawings in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present.

Figure 1:
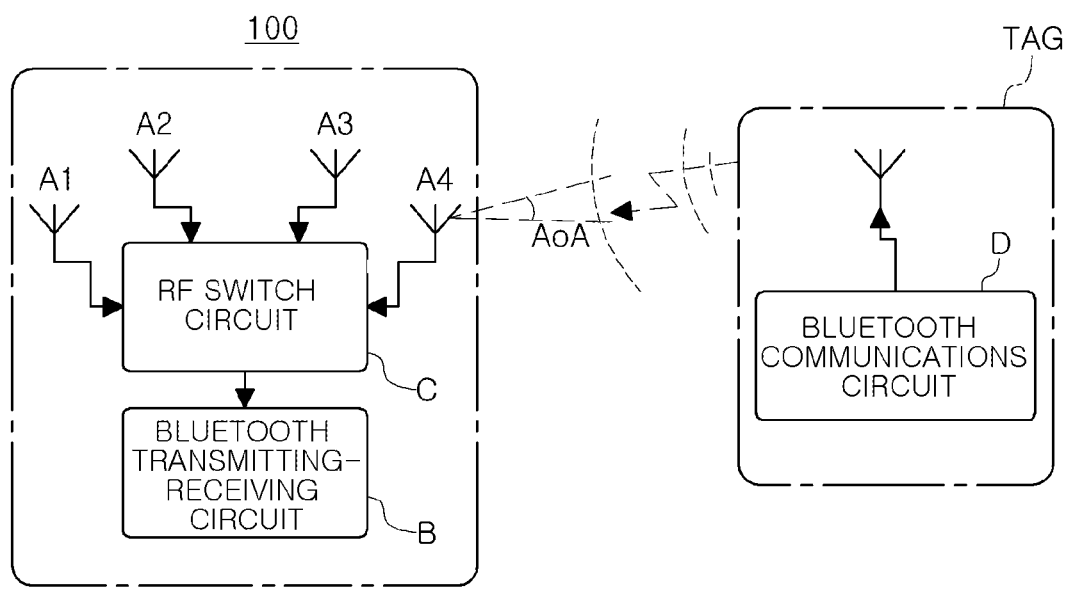
FIG. 1 is a view illustrating a signal transmitting-receiving apparatus performing a Bluetooth angle of arrival (AOA) operation, according to an embodiment.

FIG. 1 is a view illustrating a signal transmitting-receiving apparatus performing a Bluetooth angle of arrival (AOA) operation, according to an embodiment.

Referring to FIG. 1, a signal transmitting-receiving apparatus 100, according to an embodiment, includes a plurality of antennas A1, A2, A3, and A4, a Bluetooth transmitting-receiving circuit B, and a radio frequency (RF) switch circuit C.

The signal transmitting-receiving apparatus 100 receives a Bluetooth packet, which is periodically transmitted from an RF tag having one antenna or a Bluetooth communications circuit D of a mobile communications terminal, to track a location of the RF tag or the mobile communications terminal.

The RF switch circuit C of the signal transmitting-receiving apparatus 100 switches connections with the plurality of antennas A1, A2, A3, and A4 depending on a signal strength, signal direction, signal frequency band, or other conditions. The Bluetooth transmitting-receiving circuit B estimates an angle of arrival and a received signal strength indicator (RSSI) value from Bluetooth data received from the corresponding antenna to calculate the location of the RF tag or the mobile communications terminal.

Figure 2:
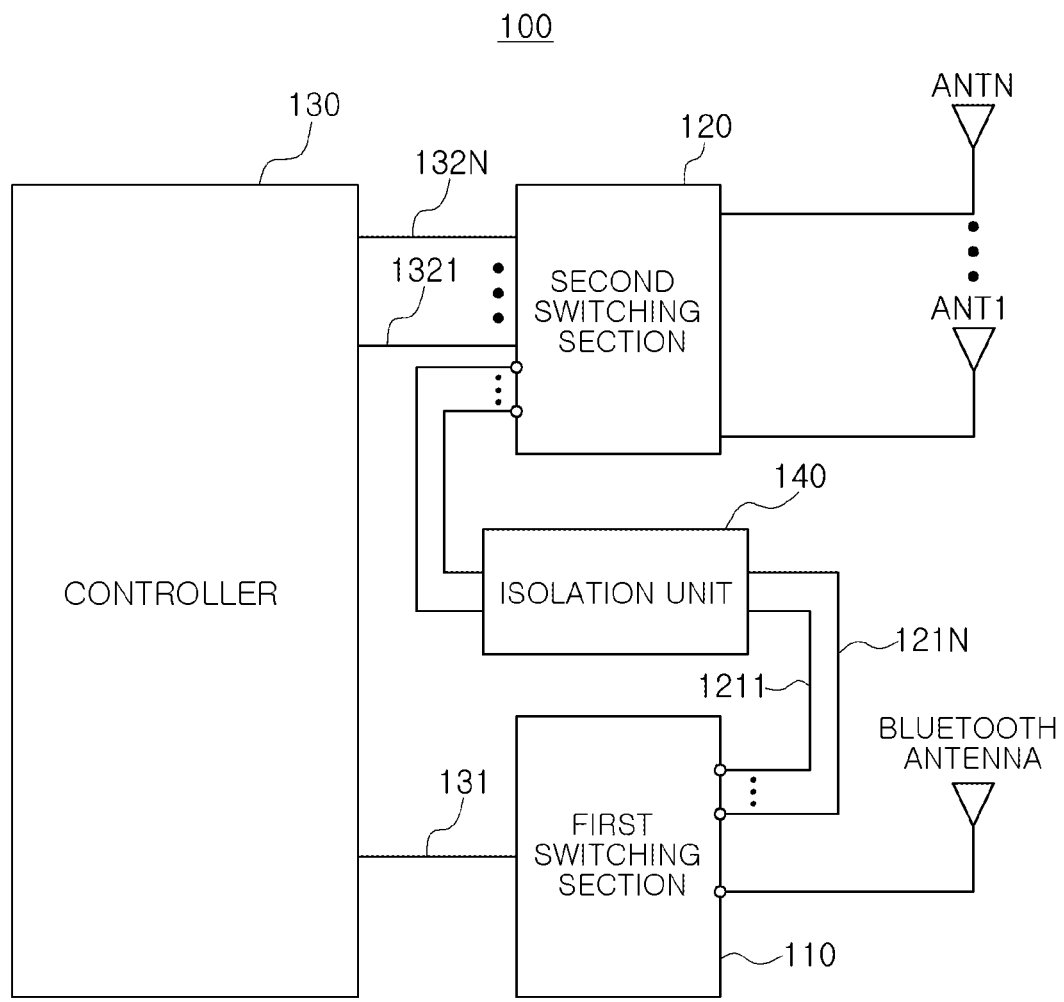
FIG. 2 is a schematic block diagram of the signal transmitting-receiving apparatus, according to an embodiment.

FIG. 2 is a schematic block diagram of the signal transmitting-receiving apparatus, according to an embodiment.

Referring to FIG. 2, the signal transmitting-receiving apparatus 100, according to an embodiment, includes a first switching section 110, a second switching section 120, a controller 130, and an isolation unit 140.

The first switching section 110 connects to the controller 130 through a Bluetooth signal transmitting-receiving line 131. The first switching section 110 is connected to a Bluetooth antenna. The Bluetooth antenna externally transmits a Bluetooth signal generated at the controller 130 and transmitted through the Bluetooth signal transmitting-receiving line 131. The first switching section 110 includes Bluetooth signal receiving lines 1211 to 121N that connect to the second switching section 120, through the isolation unit 140 to receive Bluetooth signals from a plurality of antennas ANT1 to ANTN. The first switching section 110 transmits the Bluetooth signals from the antennas ANT1 to ANTN to the controller 130 via the Bluetooth signal transmitting-receiving line 131.

The second switching section 120 connects the antennas ANT1 to ANTN and Wi-Fi signal transmitting-receiving lines 1321 to 132N to each other to transmit a Wi-Fi signal from the controller 130. In the alternative, the second switching section 120 connects the antennas ANT1 to ANTN and Wi-Fi signal transmitting-receiving lines 1321 to 132N to each other to receive Wi-Fi signals and relay them to the controller 130.

Thus, the second switching section 120 connects the Bluetooth signal receiving lines 1211 to 121N and the antennas ANT1 to ANTN to each other, through the isolation unit 140, to transmit the Bluetooth signals received from the antennas ANT1 to ANTN to the controller 130.

The controller 130 generates the Bluetooth signals and the Wi-Fi signals to be transmitted and performs signal processing for the received Bluetooth signals and Wi-Fi signals, to execute various operations based on data included in the signals.

For example, the controller 130 calculates a location of a target device to/from which the signals are transmitted and received, based on the received Bluetooth signals.

The location of the target device is calculated by estimating the angle of arrival and the RSSI value based on the Bluetooth signals received by the antennas ANT1 to ANTN.

Figure 3:
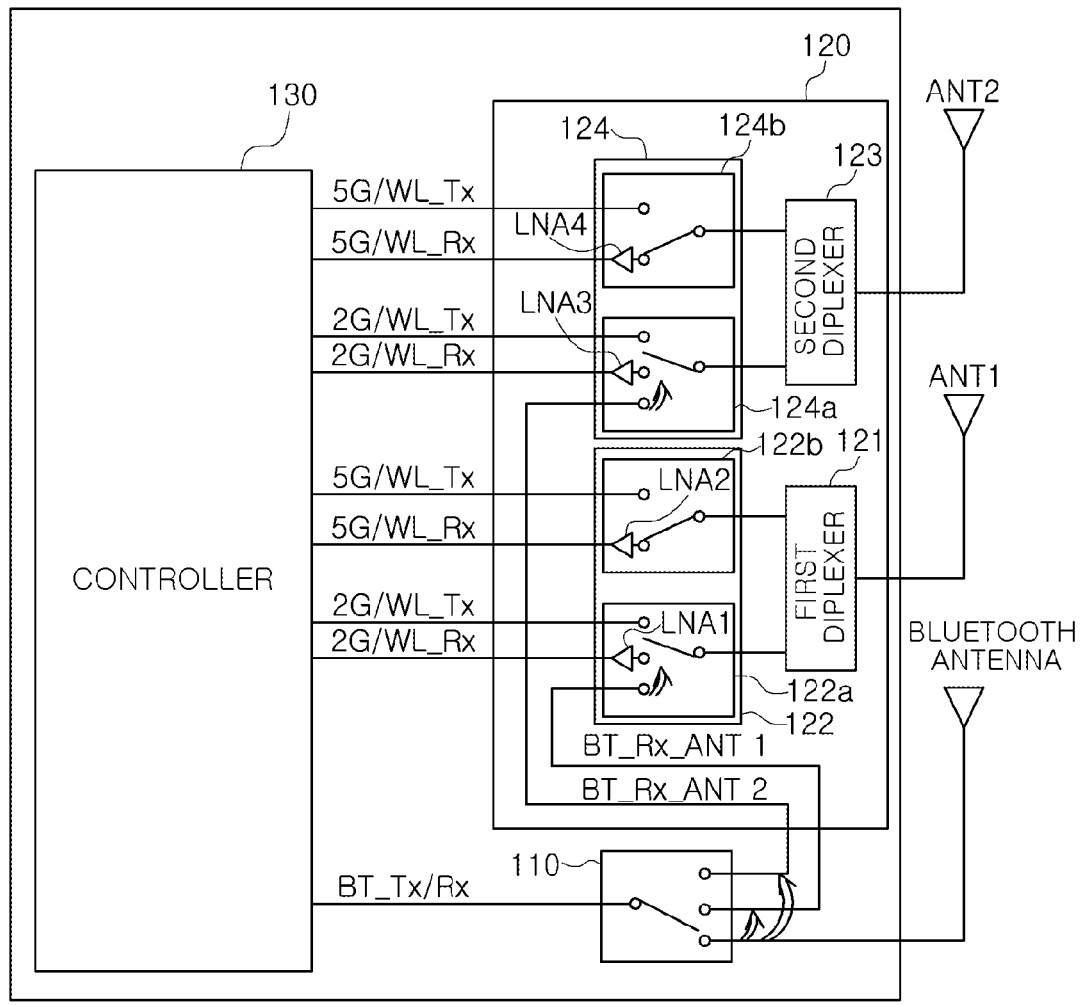
FIG. 3 is a schematic block diagram illustrating a signal coupling phenomenon in the signal transmitting-receiving apparatus, according to an embodiment.

FIG. 3 is a schematic block diagram illustrating a signal coupling phenomenon in the signal transmitting-receiving apparatus, according to an embodiment.

Referring to FIG. 3, when a Bluetooth signal is transmitted through a Bluetooth antenna, the first switching section 110 connects Bluetooth signal transmitting-receiving lines BT_Tx/Rx to the Bluetooth antenna. In an example, because Bluetooth signal receiving terminals are disposed to be adjacent to each other, a Bluetooth signal to be transmitted is coupled to the Bluetooth signal receiving lines BT_Rx_ANT_1 and BT_Rx_ANT_2, and the coupled signal is transmitted along the Bluetooth signal receiving lines BT_Rx_ANT_1 and BT_Rx_ANT_2 to be coupled to Wi-Fi signal receiving lines 2G/WL_Rx, which are connected to first switch units 122a and 124a of first and second switching parts 122 and 124 of the second switching section 120.

Furthermore, the signals are introduced into low noise amplifiers LNA1 and LNA3 connected to the Wi-Fi signal receiving lines 2G/WL_Rx.

For example, when the Bluetooth signal of 10 dBm is transmitted, the Bluetooth signal of −15 dBm is coupled to the Bluetooth signal receiving lines BT_Rx_ANT_1 and BT_Rx_ANT_2, and the Bluetooth signal of −40 dBm is introduced into the low noise amplifiers LNA1 and LNA3 connected to the Wi-Fi signal receiving lines 2G/WL_Rx. The above-mentioned example may influence a Wi-Fi signal receiving operation, and in some cases, the low noise amplifiers LNA1 and LNA3 may be broken down.

Figure 4:
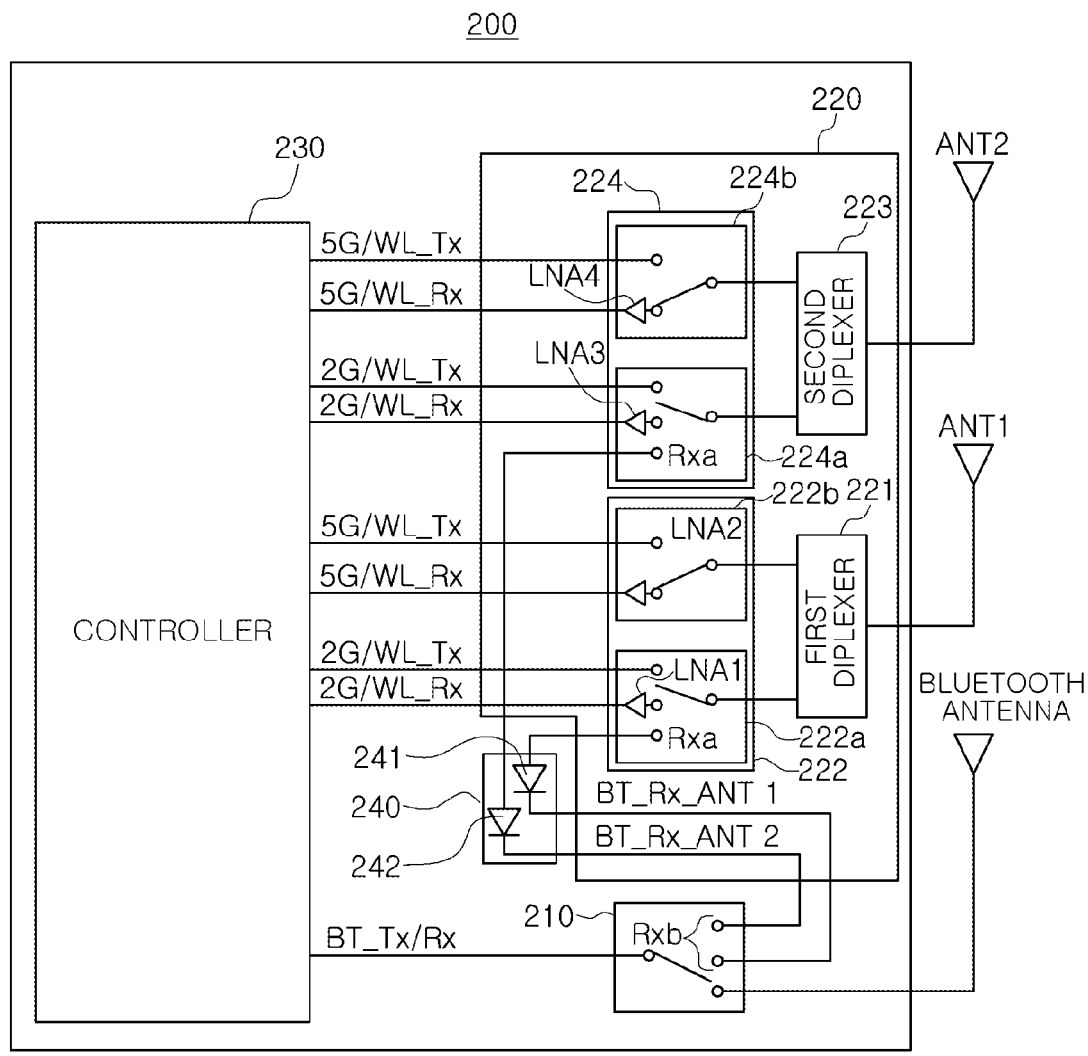
FIG. 4 is a block diagram illustrating an example of the signal transmitting-receiving apparatus, according to an embodiment.
Figure 5:
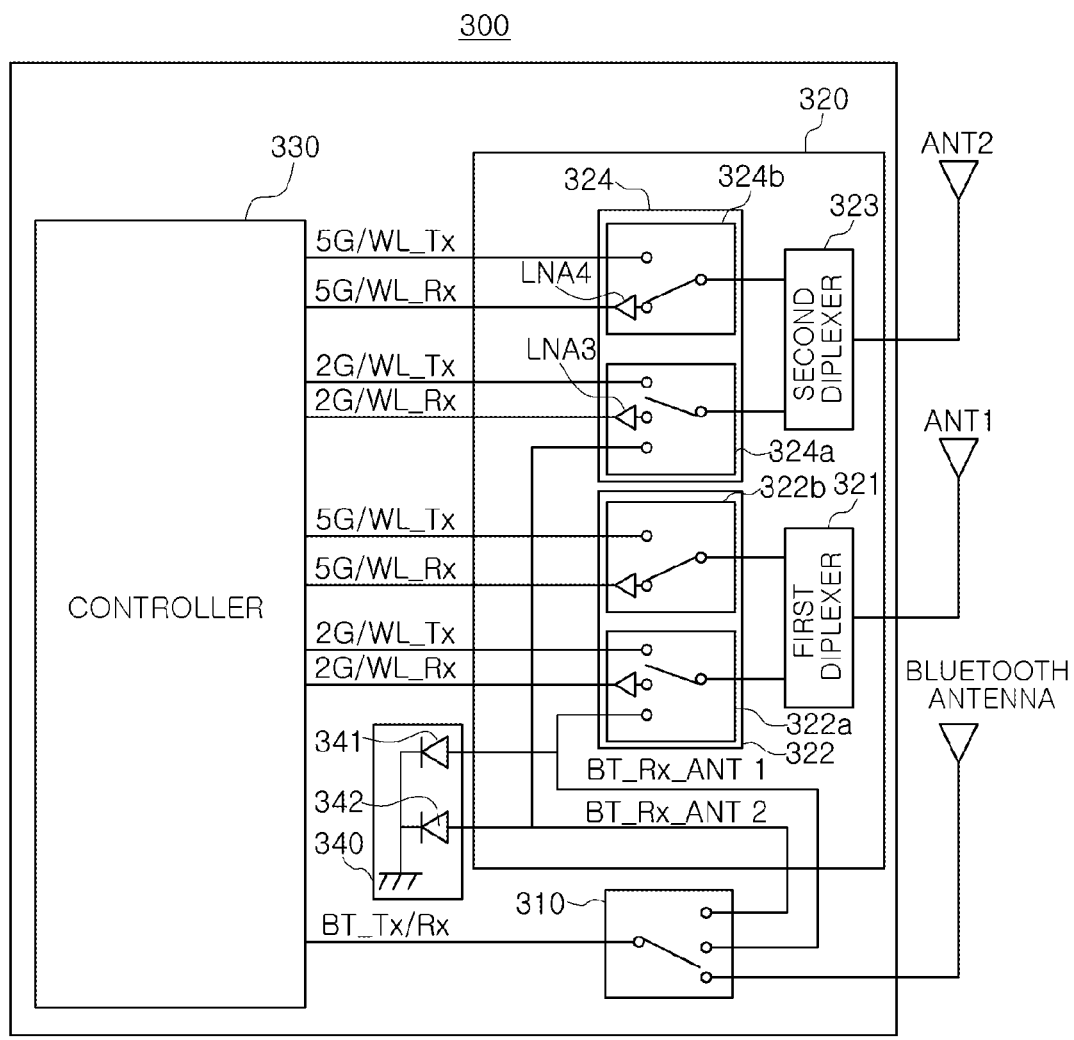
FIG. 5 is a block diagram illustrating another example of a signal transmitting-receiving apparatus, according to an embodiment.

In order to solve the above-mentioned problems, isolation units 140, 240, and 340 as illustrated in FIGS. 2, 4, and 5 are embodied.

FIG. 4 is a block diagram illustrating an example of the signal transmitting-receiving apparatus, according to an embodiment.

Referring to FIG. 4, an isolation unit 240 of a signal transmitting-receiving apparatus 200, according to an embodiment, is formed in a middle position of Bluetooth signal receiving lines BT_Rx_ANT_1 and BT_Rx_ANT_2 between a first switching section 210 and a second switching section 220.

The isolation unit 240 includes pin diodes 241 and 242.

Anodes of the pin diodes 241 and 242 are connected to Bluetooth signal receiving terminals Rxa of first switching units 222a and 224a along the Bluetooth signal receiving lines BT_Rx_ANT_1 and BT_Rx_ANT_2. Cathodes of the pin diodes 241 and 242 are connected to a Bluetooth signal receiving terminal Rxb of the first switching section 210, along the Bluetooth signal receiving lines BT_Rx_ANT_1 and BT_Rx_ANT_2.

The pin diodes 241 and 242 are connected between the first switching section 210 and the second switching section 220 in a reverse bias state. When a Bluetooth signal is transmitted through a Bluetooth antenna, a power level of the Bluetooth signal coupled to the Bluetooth signal receiving lines BT_Rx_ANT_1 and BT_Rx_ANT_2 is attenuated by the pin diodes 241 and 242. As a result, the Bluetooth signal is suppressed from being coupled to low noise amplifiers LNA1 and LNA3, which are connected to Wi-Fi signal receiving lines 2G/WL_Rx. The Wi-Fi signal receiving lines 2G/WL_Rx are connected to the first switching units 222a and 224a of the first and second switching parts 222 and 224 of the second switching section 220.

On the other hand, because the pin diodes 241 and 242 are connected between the second switching section 220 and the first switching section 210 in a forward bias state when the Bluetooth signal is received, the Bluetooth signal is transmitted to the controller 230 along the Bluetooth signal receiving lines BT_Rx_ANT_1 and BT_Rx_ANT_2 and a Bluetooth signal transmitting-receiving line BT_Tx/Rx.

Furthermore, the signal transmitting-receiving apparatus 200, according to the embodiment, transmits and receives Wi-Fi signals through first and second antennas ANT1 and ANT2, for example, and the Wi-Fi signals are transmitted and received in a first frequency band and a second frequency band.

For example, the Wi-Fi signal of the first frequency band uses a frequency band of 2 GHz, and the Wi-Fi signal of a second frequency band uses a frequency band of 5 GHz.

The second switching section 220 includes, for example, first and second diplexers 221 and 223. The first diplexer 221 transmits and receives the Wi-Fi signal of the first frequency band and the Wi-Fi signal of the second frequency band through the first antenna ANT1, and the second diplexer 223 transmits and receives the Wi-Fi signal of the first frequency band and the Wi-Fi signal of the second frequency band through the second antenna ANT2.

The first and second diplexers 221 and 223 provide different signal transfer paths depending on the frequency band.

The second switching section 220 includes, for example, the first switching part 222 and the second switching part 224.

The first switching part 222 transmits and receives the Wi-Fi signal to and from the first antenna ANT1 through the first diplexer 221, and the second switching part 224 transmits and receives the Wi-Fi signal to and from the second antenna ANT2 through the second diplexer 223.

The first and second switching parts 222 and 224 each includes first switching units 222a and 224a configured to transmit and receive the Wi-Fi signal of the first frequency band. Also, the first and second switching parts 222 and 224 each includes second switching units 222b and 224b configured to transmit and receive the Wi-Fi signal of the second frequency band.

The first switching units 222a and 224a connect a signal transfer path of the first frequency band of the first or second diplexer 221 or 222, to a Wi-Fi signal receiving line 2G/WL_Rx of the first frequency band or a Wi-Fi signal transmitting line 2G/WL_Tx of the first frequency band. The first switching units 222a and 224a connect the signal transfer path and the Wi-Fi signal receiving or transmitting line of first frequency band to each other to transmit and receive the Wi-Fi signal of the first frequency band.

Each of the first switch units 222a and 224a includes low noise amplifiers LNA1 and LNA3, respectively, to amplify a level of the received Wi-Fi signal of the first frequency band.

Further, the first switching units 222a and 224a connect the signal transfer path of the first frequency band of the first or second diplexer 221 or 222 and the Bluetooth signal receiving lines BT_Rx_ANT_1 and BT_Rx_ANT_2, to receive the Bluetooth signal through the first and second antennas ANT1 and ANT2.

The second switching units 222b and 224b connect a signal transfer path of the second frequency band of the first or second diplexer 221 or 222 and a Wi-Fi signal receiving line 5G/WL_Rx of the second frequency band or a Wi-Fi signal transmitting line 5G/WL_Tx of the second frequency band. The second switching units 222b and 224b connect the signal transfer path and the Wi-Fi signal receiving or transmitting line of second frequency band to each other to transmit and receive the Wi-Fi signal of the second frequency band.

Each of the second switch units 222b and 224b includes low noise amplifiers LNA2 and LNA4, respectively, to amplify a level of the received Wi-Fi signal of the second frequency band.

FIG. 5 is a block diagram illustrating another example of the signal transmitting-receiving apparatus, according to an embodiment.

Referring to FIG. 5, an isolation unit 340 of a signal transmitting-receiving apparatus 300, according to an embodiment, includes pin diodes 341 and 342. Anodes of the pin diodes 324 and 342 are connected to Bluetooth signal receiving lines BT_Rx_ANT_1 and BT_Rx_ANT_2, and cathodes of the pin diodes 341 and 342 are connected to a ground.

In a case in which a Bluetooth signal to be transmitted is coupled to the Bluetooth signal receiving lines BT_Rx_ANT_1 and BT_Rx_ANT_2, the pin diodes 341 and 342 enter a forward bias state. Thus, the Bluetooth signal coupled to the Bluetooth signal receiving lines BT_Rx_ANT_1 and BT_Rx_ANT_2 is bypassed to the ground.

On the other hand, because the pin diodes 341 and 342 are in a zero bias state at the time of receiving the Bluetooth signal in a second switching section 320, the received Bluetooth signal is transmitted to a controller 330 along the Bluetooth signal receiving lines BT_Rx_ANT_1 and BT_Rx_ANT_2 and a Bluetooth signal transmitting-receiving line BT_Tx/Rx.

As set forth above, according to various embodiments, a phenomenon in which the transmission signal of Bluetooth is coupled to the Wi-Fi signal receiving terminal is suppressed, whereby reception performance of Wi-Fi may be guaranteed during the Bluetooth AOA operation and the internal elements are protected.

The apparatuses, units, and other components illustrated in FIGS. 1-5 are implemented by hardware components. Examples of hardware components include controllers, processors, switches, diodes, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A signal transmitting-receiving apparatus, comprising:
a first switching section configured to connect Bluetooth signal receiving lines to a Bluetooth antenna;
a second switching section configured to connect antennas to one of a Bluetooth receiving terminal, a Wi-Fi signal receiving terminal, and a Wi-Fi signal transmitting terminal;
a controller configured to signal process a Bluetooth signal and a Wi-Fi signal that are transmitted and received; and
an isolation unit comprising diodes connected between the first switching section and the second switching section and configured to suppress the Bluetooth signal from interfering with the Wi-Fi signal receiving terminal.

2. The signal transmitting-receiving apparatus of claim 1, wherein the second switching section further comprises:
diplexers configured to be connected to the antennas to respectively provide signal transfer paths of a Wi-Fi signal of a first frequency band and a Wi-Fi signal of a second frequency band; and
switching parts configured to be connected to the diplexers to switch transmission and reception of the Wi-Fi signal of the first frequency band and the Wi-Fi signal of the second frequency band.

3. The signal transmitting-receiving apparatus of claim 2, wherein each of the switching parts comprises:
a first switching unit configured to switch the transmission and reception of the Wi-Fi signal of the first frequency band; and
a second switching unit configured to switch the transmission and reception of the Wi-Fi signal of the second frequency band and switching a signal transfer path of the Bluetooth signal received from one of the antennas transmitting and receiving the Wi-Fi signal of the second frequency band.

4. The signal transmitting-receiving apparatus of claim 3, wherein the second switching unit further comprises:
low noise amplifiers configured to amplify a level of the received Wi-Fi signal of the second frequency band.

5. The signal transmitting-receiving apparatus of claim 1, wherein the isolation unit is configured to suppress the Bluetooth signal from interfering with the Wi-Fi signal receiving terminal during a Bluetooth Angle of Arrival (AOA) operation.

6. The signal transmitting-receiving apparatus of claim 5, wherein the first switching section and the second switching section are simultaneously connected.

7. An apparatus, comprising:
a first switching section configured to connect Bluetooth signal receiving lines to a Bluetooth antenna;
a second switching section configured to connect antennas to one of a Bluetooth receiving terminal, a Wi-Fi signal receiving terminal, and a Wi-Fi signal transmitting terminal;
a controller configured to signal process a Bluetooth signal and a Wi-Fi signal that are transmitted and received; and
an isolation unit configured to suppress the Bluetooth signal from being coupled to the Wi-Fi signal receiving terminal along the Bluetooth signal receiving lines,
wherein the isolation unit further comprises:
pin diodes connected in a middle position of the Bluetooth signal receiving lines,
anodes of the pin diodes configured to be connected to the Bluetooth receiving terminal of the second switching section, and
cathodes of the pin diodes configured to be connected to the Bluetooth receiving terminal of the first switching section.

8. An apparatus, comprising:
a first switching section configured to connect Bluetooth signal receiving lines to a Bluetooth antenna;
a second switching section configured to connect antennas to one of a Bluetooth receiving terminal, a Wi-Fi signal receiving terminal, and a Wi-Fi signal transmitting terminal;
a controller configured to signal process a Bluetooth signal and a Wi-Fi signal that are transmitted and received; and
an isolation unit configured to suppress the transmitted Bluetooth signal from being coupled to the Wi-Fi signal receiving terminal along the Bluetooth signal receiving lines,
wherein the isolation unit further comprises:
pin diodes configured to be connected between the Bluetooth signal receiving lines and a ground,
anodes of the pin diodes configured to be connected to the Bluetooth signal receiving lines, and
cathodes of the pin diodes configured to be connected to a ground.

* * * * *